(12) United States Patent  (10) Patent No.: US 8,130,032 B1
Heaton et al.  (45) Date of Patent: Mar. 6, 2012

(54) SYSTEMS AND METHODS FOR HIGH-SENSITIVITY DETECTION OF INPUT BIAS CURRENT

(75) Inventors: Dale Alan Heaton, Lucas, TX (US); David Walker Guidry, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 12/893,346

(22) Filed: Sep. 29, 2010

(51) Int. Cl.
*G01R 19/00* (2006.01)
(52) U.S. Cl. .............................. 330/2; 330/69
(58) Field of Classification Search .......... 330/252–261, 330/2, 69
See application file for complete search history.

(56) References Cited

U.S. PATENT DOCUMENTS

| 6,268,734 | B1* | 7/2001 | Knapton | 330/69 |
| 7,253,680 | B2* | 8/2007 | Laletin | 330/69 |

* cited by examiner

*Primary Examiner* — Hieu Nguyen
(74) *Attorney, Agent, or Firm* — Steven A. Shaw; W. James Brady; Frederick J. Telecky, Jr.

(57) ABSTRACT

The invention relates to systems and methods for high-sensitivity detection of input bias current. The invention more particularly relates to platforms and techniques for the calibration and measurement of input bias current in op amps or other devices. In embodiments, the platform can incorporate a servo loop connected to a high-sensitivity test amplifier, such as an instrumentation amplifier. The test amplifier can complete a switchable circuit with the servo loop and detect a calibration input bias current for the test platform, without a production device in place. The device under test can be switched into the servo loop, and the total bias current measured with both the device under test and test amplifier in-circuit. The difference between the measured current with the device inserted and the previously measured calibration current represents the bias current for the subject device, without attaching external meters or requiring reference parts of the production type.

28 Claims, 4 Drawing Sheets

SYSTEMS AND METHODS FOR HIGH-SENSITIVITY DETECTION OF INPUT BIAS CURRENT

FIELD

The present teachings relate to systems and methods for high-sensitivity detection of input bias current, and more particularly, to platforms and techniques for testing the low-level input bias current of production operational amplifiers.

BACKGROUND OF RELATED ART

Operational amplifiers (often abbreviated "op amps") are common semiconductor parts often configured to provide amplification of a comparative or differential signal represented by the difference between inputs on a positive ("+") pin and a negative ("−") pin. Op amps are often used to amplify low-level signals. In order to achieve better amplification results, particularly at the limits of amplifier sensitivity, it is useful for the manufacturer of op amp parts to be able to identify the inherent leakage current, or input bias current, that flows into the op amp inputs in the absence of an input signal.

It is known to attempt to measure the input bias current (sometimes referred to as MB current) of op amps or other parts using various techniques. As shown in FIG. 1A, in some conventional testing platforms, referred to as pico-amp meters (PAMs), the op amp or other device under test is connected to a much higher sensitivity op amp, such as an instrumentation op amp, by a lead wire leading from the op amp under test to the remotely attached instrumentation amp. The remote amp can serve to convert the input bias current to voltage, and measure the value of the input bias current over time based on the converted voltage. In conventional configurations of this type, although the remote instrumentation amp may have higher sensitivity than the op amp under test, the attachment of lead wires, which can be up to several inches in length or more, can produce stray capacitance, leakages, or other electrical effects which offset or distort the high-sensitivity measurement by the remote PAM. These unintended effects can skew or invalidate the input bias current results. While some of these effects can be measured and calibrated out, those leakages and other effects may not be stationary over time, creating a measurement floor due to that drift.

As shown in FIG. 1B, in other known op amp test platforms, a servo loop can be added in parallel to the actual device under test which integrates the input bias current over time via a sensing capacitor. In this arrangement, known as a remote integrator, the servo loop create a feedback effect in which the slope of the op amp's voltage output is proportionate to the input bias current, which can then be derived from that captured voltage data. Sensitivity can be adjusted by selecting values for the sensing capacitor and the length of the test run time, and can achieve desirable levels in the femto Ampere (fA) range, sufficient to measure most manufactured op amps at present. However, the use of a remote integrator test arrangement also requires that the device under test be placed in the circuit to actually close the servo loop. The resulting voltage ramp is not, however, guaranteed to produce consistent results depending on the characteristics of each op amp or other device under test. Test platforms using remote integration therefore have required the use of reference or "golden" sample units whose input bias values or other parameters are known, through independent means, to be within desired ranges. This requires the periodic insertion and verification of the remote integrator platform using such reference or correlation parts, which may not be efficient or desirable in a manufacturing or other production environment.

It may be desirable to provide methods and systems for high-sensitivity detection of input bias current which can provide in-circuit input bias current testing capability for op amps or other parts to within a high degree of sensitivity, without the use of long attached connection leads or a requirement for reference parts.

SUMMARY

The invention overcoming these and other issues in the art is directed in regards to systems and methods for high-sensitivity detection of input bias current in which the input bias current of a device under test, including op amps and other devices, can be measured with a high degree of accuracy or precision, to within at least the sub-pico ampere range. According to embodiments, platforms and techniques consistent with the present teachings can generate high-accuracy input bias current readings on factory or production lots of devices under test, without a need for reference parts on the factory floor and without the use of extended lead wires which could affect low-level measurement accuracy. The inventors of the present design determined that it is possible to insert a servo loop into an input bias test platform which is connected to an onboard instrumentation amplifier, such as a buffered high-sensitivity op amp, in a switchable parallel configuration with a socket or other receptacle for the device under test. The inventors determined that the local instrumentation amplifier CaO be used to complete and drive the servo loop in the absence of an inserted device under test, and therefore establish a reference of calibration amount of input bias current. The inventors determined that then inserting the device under test with the instrumentation amplifier switched into a parallel connection with the device under test permits the measurement of a combined input bias current, a portion of which is contributed by the device under test and the remainder of which represented by the calibrated input bias current produced or registered by the instrumentation amplifier in the absence of the device under test. The input bias current of the device under test can then be calculated by subtracting the calibrated input bias current from the measured total. The inventors thereby have avoided the need for a "gold" or reference standard for calibration purposes, have avoided the need for the device under test to be inserted in the measurement process to close the servo loop, and have avoided the need for relatively long lead wires which could contribute stray capacitance or other leakages or distortions in the measurement process.

DESCRIPTION OF THE DRAWINGS

The accompanying drawings, which are incorporated in and constitute a part of this specification, illustrate embodiments of the present teachings and together with the description, serve to explain the principles of the present teachings. In the figures.

DESCRIPTION OF EMBODIMENTS

Aspects of the present teachings relate to systems and methods for high-sensitivity detection of input bias current. More particularly, aspects relate to platforms and techniques for incorporating a servo loop driven via a high-sensitivity test amplifier, such as an instrumentation amplifier, that is connect to the operational amplifier and/or other device under test. The high-sensitivity test amplifier can be controlled by relay or other switch to complete the servo loop circuit without a device under test in place in the circuit, and generate a value for the input bias current innate to the testing platform itself. After that value is determined, the op amp or other device under test can be inserted into the calibration circuit and the resulting combined input bias current, partly contributed by the high-sensitivity test amplifier portion of the circuit and partly contributed by the individual device under test, can be measured using a sensing capacitor provided in the servo loop circuit. Because no external PAM is used, no stray leakage from excess lead lengths is introduced. Because the input bias current of the high-sensitivity test amplifier, substantially co-located with the device under test, is calibrated out, the accuracy of the input bias current value that is determined for each production device under test is enhanced.

Reference will now be made in detail to exemplary embodiments of the present teachings, which are illustrated in the accompanying drawings. Where possible the same reference numbers will be used throughout the drawings to refer to the same or like parts.

Figure 1A:
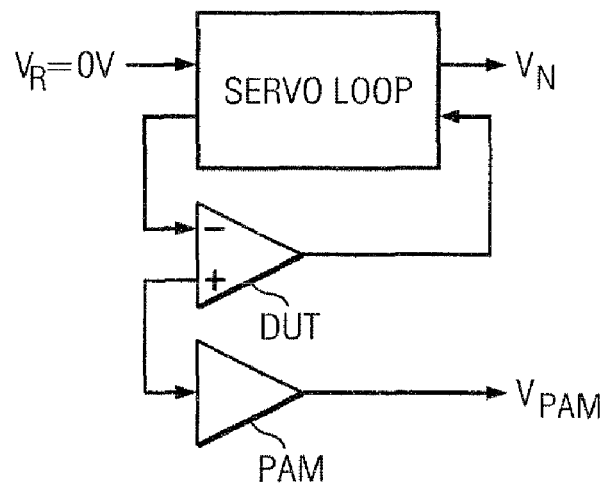
FIGS. 1A and 1B illustrate known input bias current test bed configurations, according to various aspects.
Figure 1B:
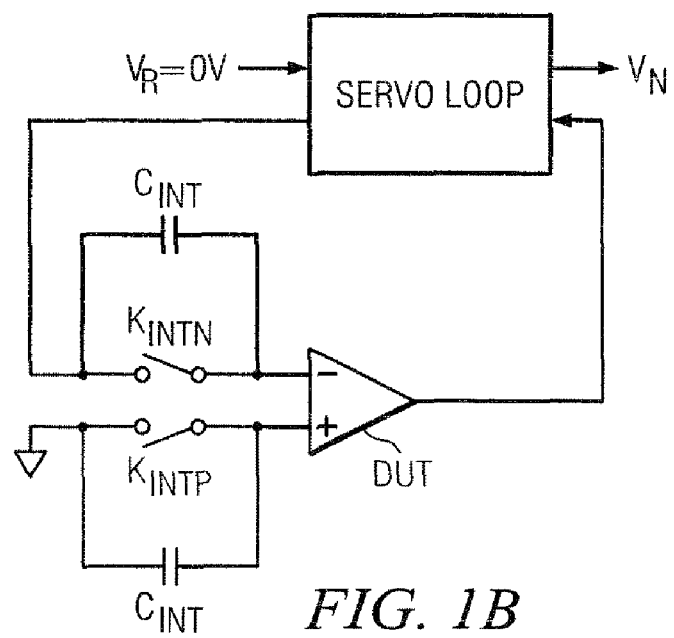
Figure 2:
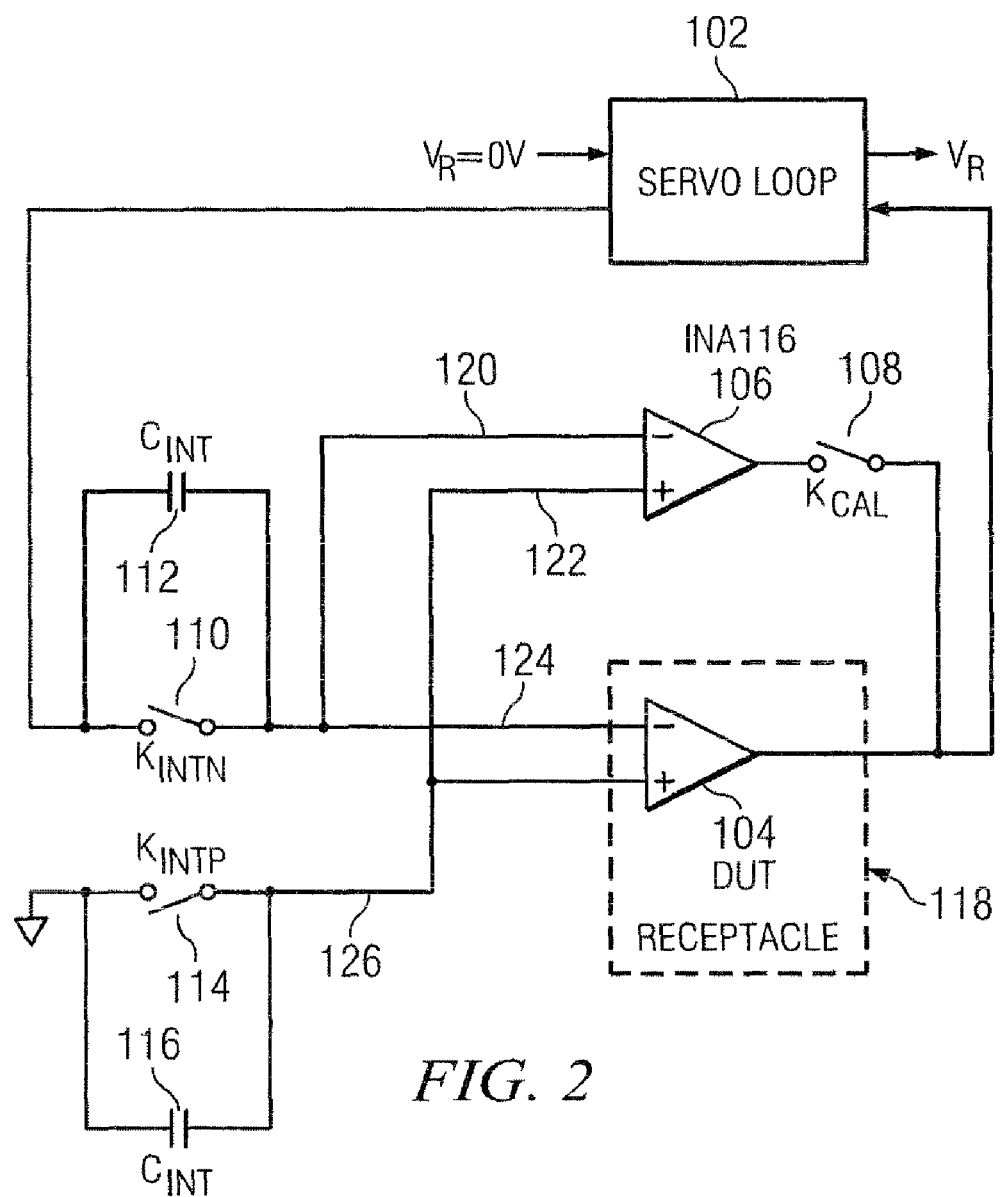
FIG. 2 illustrates a calibration platform that can be used in systems and methods for high-sensitivity detection of input bias current, according to various aspects of the present teachings.

FIG. 2 illustrates an overall platform 100 for high-sensitivity detection of input bias current, according to various embodiments. More particularly, embodiments related to platforms and techniques for the calibration and measurement of input bias current in a device under test 104. In embodiments, the device under test 104 can be or include an operational amplifier, and/or other electronic or semiconductor device, such as an oscillator or other part. In embodiments, the system can incorporate a servo loop 102 switchably connected to a high-sensitivity test amplifier 106 via a calibration relay 108. In embodiments, the high-sensitivity test amplifier 106 can be or include an instrumentation amplifier, which can comprise an operational amplifier with built-in buffer circuits to present a high-impedance input to the circuit to which the high-sensitivity test amplifier 106 is attached.

In embodiments as shown, the high-sensitivity test amplifier 106 can be connected in series with the servo loop 102 via the calibration relay 108. In terms of calibration operations, the high-sensitivity test amplifier 106 can initially be switched out of the circuit with the servo loop 102 by leaving the calibration relay 108 open. The device under test 104 can be similarly initially left out of the circuit by simply not inserting the device under test 104 into a socket or other receptacle 118 that seats and inserts the device under test 104 into the circuit connected in series with the servo loop 102 and in parallel to the high-sensitivity test amplifier 106. Without the device under test 104 being inserted or mounted in the receptacle 118, the circuit of the servo loop 102 is completed exclusively via the high-sensitivity test amplifier 106 with the calibration relay 108 being switched closed.

With the calibration relay 108 being closed to complete the circuit, an input bias current measurement can be made on the high-sensitivity test amplifier 106 in isolation. In merely illustrative implementations, an instrumentation amplifier such as the commercially available IN/116 part available from Texas Instruments, Inc., Dallas, Tex., can be used as the high-sensitivity test amplifier 106, whose leakage is rated by the manufacturer at +/−25 fA, so that in implementation using that part can be calibrated at above the worst case error bounds or limits of +/−25 fA. In implementations, other instrumentation amplifiers other than the aforementioned commercial part can be used. In further implementations, other high-sensitivity amplifiers other than an instrumentation-type amplifier can be used for high-sensitivity test amplifier 106.

According to embodiments in various regards, the high-sensitivity test amplifier 106 can be mounted or installed in the overall platform 100 at a physical position close to the receptacle 118, for instance, abutting the receptacle 118 or adjoining the receptacle 118 and therefore the high-sensitivity test amplifier 106 by comparatively short distances, such as 5 mm, 10 mm, or other distances. In embodiments in various further regards, the high-sensitivity test amplifier 106 can be permanently mounted or affixed in platform 100, and permanently connected in the circuitry of the platform 100, including to reside in series connection with the servo loop 102. In various embodiments, the high-sensitivity test amplifier 106 can be maintained in a powered-on state in the platform 100 at all times, so that the platform 100 can in regards achieve average stationary current offset calibrations to precision that is better, and potentially significantly better, than the worst case.

In terms of calibration operations, preparation for the testing and calibration of the high-sensitivity test amplifier 106 for each part in a production lot, or parts grouped or collected on another basis, can begin before the first high-sensitivity test amplifier 106 is inserted for factory or other measurement or calibration. In aspects, initial calibration operations can be carried out with no high-sensitivity test amplifier 106 inserted and with the servo loop 102 and high-sensitivity test amplifier 106 in a powered-on state. In aspects, each of the negative pin 120 of the high-sensitivity test amplifier 106 and the positive pin 122 of the high-sensitivity test amplifier 106 can be calibrated separately. The calibration of the input bias current on those pins can be carried out without the device under test 104 being inserted into the receptacle 118. In aspects, the calibration relay 108 can be thrown or closed to connect the high-sensitivity test amplifier 106 to the circuit, and negative-pin integration relay 110 can be thrown or closed to connect the negative-pin integration capacitor 112 to the circuit in series with the servo loop 102 and the high-sensitivity test amplifier 106. In aspects, the closing of calibration relay 108 and/or negative-pin integration relay 110 can be done by manual input or selection by a user, and/or under automated control, such as by commands issued by a control application operating in conjunction with the platform 100.

The completed circuit can permit the negative-pin integration capacitor 112 to begin to charge based on the bias current flowing out of the negative pin 120 of the 106. The servo loop 102 compensates for the accumulating voltage across the negative-pin integration capacitor 112, and this value can be digitized from that voltage by software or other logic hosted on platform 100. According to embodiments, the input bias voltage calculated for the circuit without any high-sensitivity test amplifier 106 can then be computed according to:

$$\text{Input Bias Current}(IIB) = C_{INT} \cdot \Delta V_R / (\Delta \text{time} \cdot \text{GAIN}_{LOOP}) \quad \text{FORMULA 1}$$

This value can then be stored in or by platform 100, for instance to a personal computer or workstation attached to or communicating with the platform 100. The calibration relay 108 and negative-pin integration capacitor 112 can then be opened, and the same process for detecting and capturing the calibration input bias current can be repeated for the positive pin 122 of the high-sensitivity test amplifier 106, by switching the calibration relay 108 and a positive pin integration relay 114 in a corresponding step to charge a positive pin integration capacitor 116, and detect and store an input bias current (IIB) value for the positive pin 122 accordingly. With the calibration or background input bias current (IIB) for the platform 100 without the presence of a device under test captured in this manner, detection of the input bias current for the individual values of each device under test 104 can be conduced. In aspects, the subject device under test 104 can be inserted, and each of calibration relay 108, negative-pin integration relay 110, and positive-pin integration relay 114 can be closed or thrown. This results in the negative pin 124 of the device under test 104 being connected in parallel to the negative pin 120 of the high-sensitivity test amplifier 106, and the positive pin 126 of the device under test 104 being connected in parallel to the positive pin 122 of the high-sensitivity test amplifier 106. The circuit of the servo loop 102 is then driven by both the high-sensitivity test amplifier 106 and the device under test 104. The input bias current for the combined elements of the high-sensitivity test amplifier 106 and the device under test 104 can then be measured according to operations described above, with the combined input bias current being calculated according to Formula 1. After completion of the detection of the combined input bias current, the input bias current value for the individual device under test 104 can be calculated as:

$$IIB(\text{Input Bias Current for } DUT) = IIB_{MEASURED} - IIB_{CALIBRATED}, \quad \text{FORMULA 2}$$

This expression can be calculated for each of the negative pin 124 and the positive pin 126 of the device under test 104. The detection and evaluation of the input bias current (IIB) for each device under test 104 in a given production lot and/or other set can proceed in similar fashion.

Figure 3:
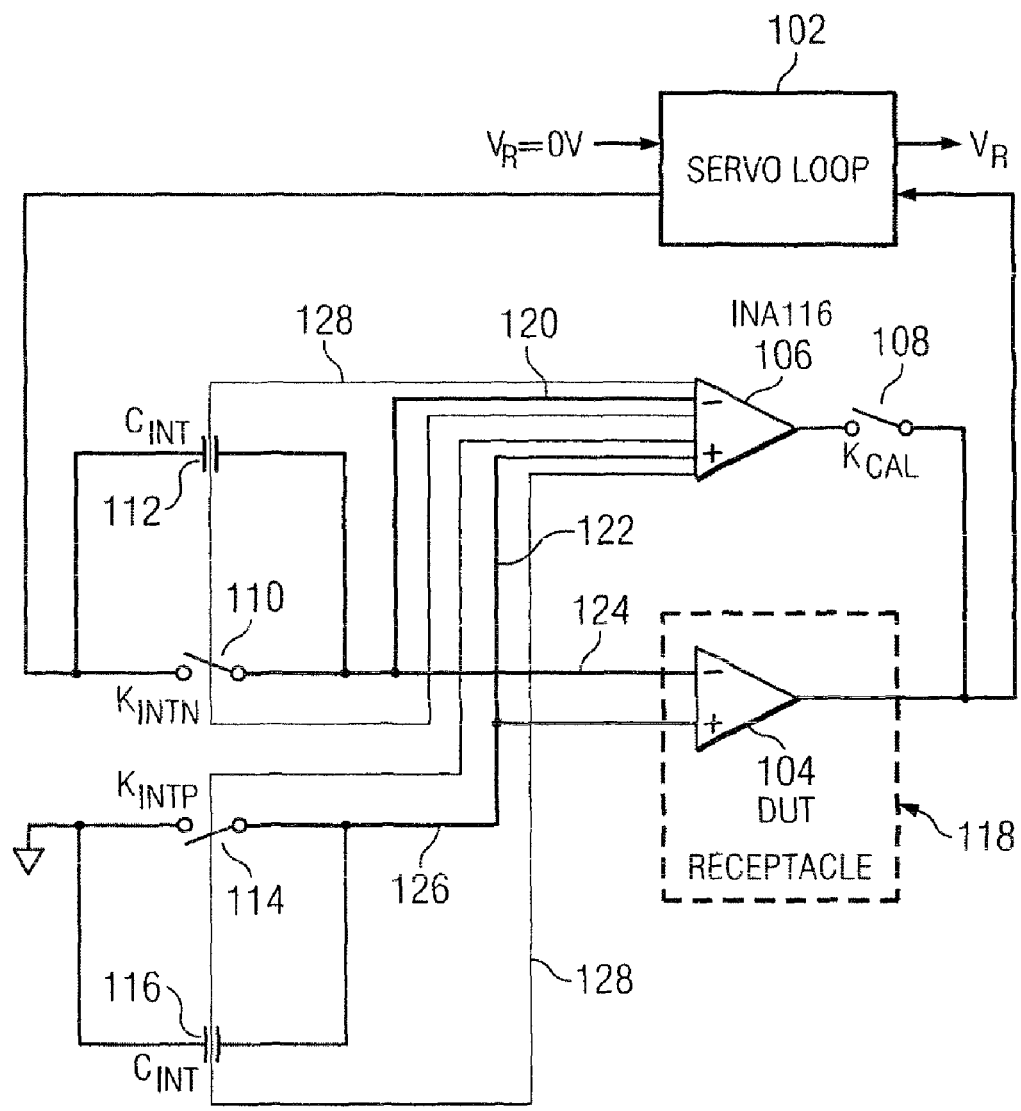
FIG. 3 illustrates a calibration platform that can be used in systems and methods for high-sensitivity detection of input bias current, according to further various aspects.

In embodiments, and as shown in FIG. 3, in addition to the connections between the servo loop 102, high-sensitivity test amplifier 106, and device under test 104, measurement and calibration stability and precision can be enhanced by the insertion of a set of driven guard circuits 128. In embodiments as shown, the set of driven guard circuits 128, indicated by dashed lines but connected via printed circuits or other electrical connects like other components of platform 100, can sense the voltage on the negative pin 120 of the high-sensitivity test amplifier 106 and/or the voltage on the positive pin 122 of the high-sensitivity test amplifier 106. The set of driven guard circuits 128 can then drive an equal, low impedance voltage. When implemented, the set of driven guard circuits 128 can surround the high impedance inputs of the high-sensitivity test amplifier 106 on the negative pin 120 and the positive pin 122, which causes any leakage currents outside the ring of the set of driven guard circuits 128 to be shunted to a ground conductor 130. This shunting action produces a lack of potential voltage difference around the negative input pin 120 and the positive input pin 122, further reducing the leakage or input bias current associated with the high-sensitivity test amplifier 106.

Figure 4:
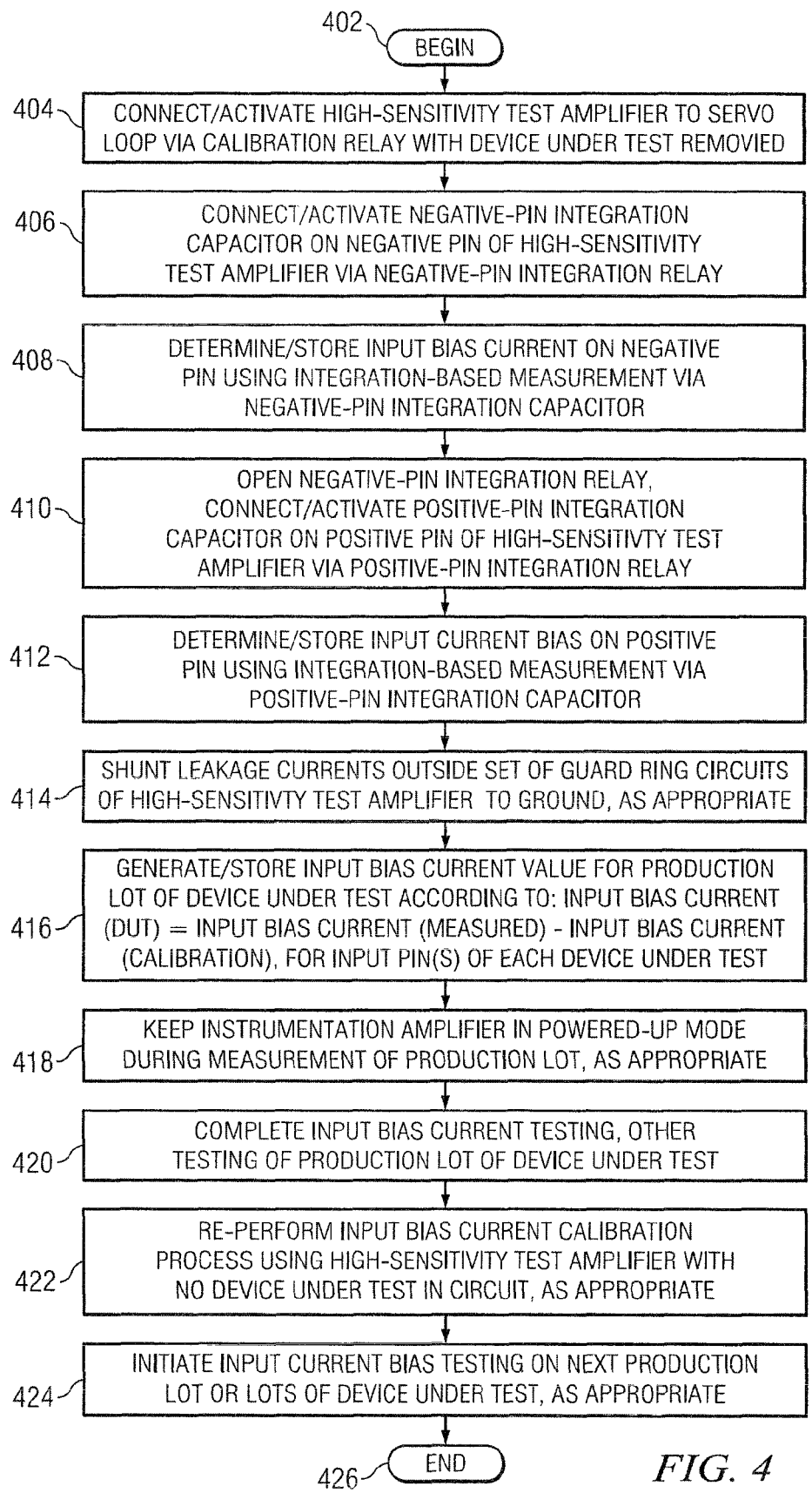
FIG. 4 illustrates overall calibration processing that can be used in systems and methods for high-sensitivity detection of input bias current, according to various aspects.

FIG. 4 illustrates processing that can be performed in overall calibration operations that can be used in systems and methods for high-sensitivity detection of input bias current, according to various embodiments. In 402, processing can begin. In 404, the high-sensitivity test amplifier 106 can be connected and/or activated to communicate or link to the servo loop 102 via the calibration relay 108 and/or other switch or control. In aspects, the high-sensitivity test amplifier 106 can be connected to the servo loop 102 with the device under test 104 removed from the receptacle 118 and/or other mounting structure for that device in platform 100. In 406, the negative-pin integration capacitor 112 on the negative pin 120 of the high-sensitivity test amplifier 106 can be connected and/or activated to communicate or link to the servo loop 102 by closing, connecting, and/or activating the negative-pin integration relay 110 and/or other switch or control. In 408, the input bias current on the negative pin 120 can be calculated, determined, sampled, and/or stored using an integration-based measurement via the negative-pin integration capacitor 110, and/or other sensing capacitor or element. In aspects, the calibration input bias current (IIB) can be generated by evaluating the expression in Formula 1 above. In aspects, the input bias current (IIB) can be sampled, calculated and/or stored using a computer, workstation, and/or other hardware, software, and/or other instrumentation or control logic (not shown).

In 410, the negative-pin integration relay 110 can be opened and/or disconnected, and the positive-pin integration capacitor 116 on the positive pin 122 of the high-sensitivity test amplifier 106 can be connected to the servo loop 102 by closing, connecting, and/or activating the positive-pin integration relay 114 and/or other switch or control. In 412, the input bias current on the positive pin 122 can be calculated, determined, sampled, and/or stored using an integration-based measurement via the positive-pin integration capacitor 116, and/or other sensing capacitor or element. In aspects, the input bias current (MB) can likewise be generated in the same manner as for negative pin 120 by evaluating the expression in Formula 1 above, and can likewise be stored to a computer, workstation, and/or other instrumentation or control logic (not shown) hosted by or associated with platform 100.

In 414, any leakage currents outside of the set of guard ring circuits 128 of the high-sensitivity test amplifier 106 can be shunted to ground, in implementations employing the set of guard ring circuits 128, as appropriate. In embodiments, other configurations of guard or shunting circuits can be used, other than the set of guard ring circuits 128 as shown. In 416, the input bias current value (IIB) for each device under test 104 for a production lot or other set of devices under test 104 can be generated according to Formula 2 noted above. The value of the input bias current for each device under test 104 can be captured and stored for each of the negative pin 120 and the positive pin 122 of the device under test 104. In aspects, a production lot of the device under test 104 can be or include a discrete set or collection of the same or similar parts, such as operational amplifiers of the same or different part types, having sequential or otherwise related serial numbers, and/or other collections of devices whose input bias current (IIB) values (e.g. per-input pin) needs to be tested before shipment or delivery to customers or others. In aspects, the measured input bias current (IIB) values for the negative pin 120, positive pin 122, and/or other tested values of the device under test 104 can be printed in printed material shipped with the device, embossed in the case of the device, recorded in electronic memory in or associated with the device, and/or stored or delivered using other media. In 418, the high-sensitivity test amplifier 106 can be kept or maintained in a powered-up mode or state throughout the testing of the present production lot or for other intervals, as appropriate.

In 420, the operator and/or automated control resources of the platform 100 can complete the input bias current (MB) testing and/or other testing or measurement operations on the set of devices under test 104 for the current production lot and/or other group of subject devices. In 422, the operator and/or other automated control resources of the platform 100 can re-perform the input bias current calibration process using the high-sensitivity test amplifier 106 with no device under test 104 in the circuit, as appropriate, for instance, when switching to a new batch of an operational amplifier or other part, and/or switching to a new device type or model for calibration operations. In 424, the operator and/or automated control resources of the platform 100 can initiated the input bias current (IIB) testing process on a next production lot or lots, or other sets, of devices under test 104, as appropriate. In 426, processing can repeat, return to a prior processing point, jump to a further processing point, or end.

The foregoing description is illustrative, and variations in configuration and implementation may occur to persons skilled in the art. For instance, the various illustrative logics, logical blocks, modules, devices, and circuits, including personal computers, cellular telephones, media playback devices, and servers, described in connection with the implementations disclosed herein may be implemented or performed with or using a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but can likewise be any conventional processor, controller, microcontroller, or state machine. A processor may also be implemented as a combination of computing devices, e.g., a combination of one or more DSPs and one or more microprocessors, multiple microprocessors, or any other configuration. In exemplary implementations, the functions described may be implemented in hardware, software, firmware, or any combination thereof. If implemented in software, the functions may be stored on or transmitted over as one or more instructions or code on a computer-readable medium. Computer-readable media includes computer storage media. A storage media may be any available media that can be accessed by a computer. By way of example only, computer-readable media can comprise RAM, ROM, EEPROM, CD-ROM, DVD-ROM. Blu-ray discs or other optical disk storage, magnetic disk storage or other magnetic storage devices, or any other medium that can be used to carry or store desired program code in the form of instructions or data structures and that can be accessed by a computer. The steps of a method or algorithm described in connection with the implementations disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium is coupled to and/or integrated with the processor, such that the processor can read information from, and write information to, the storage medium.

For further example, while implementations have been described where the servo loop 102 and the high-sensitivity test amplifier 106 are implemented as separate parts, in aspects, the servo loop 102 and the high-sensitivity test amplifier 106 can be implemented as a combined and/or monolithic part or circuit. For further example, conversely, while implementations have been described in which each of the servo loop 102 and high-sensitivity test amplifier 106 are implemented as single parts connected in platform 100, in embodiments, each or either of servo loop 102 and 106 can be implemented using multiple parts or elements, and/or can be combined with other circuits, parts, or elements. For still further example, while embodiments have been described in which the servo loop 102 and/or high-sensitivity test amplifier 106 have been described as discrete parts operating as analog circuit elements, in embodiments, some or all functions or operations performed by the servo loop 102 and/or high-sensitivity test amplifier 106 can be implemented using digital circuitry and/or computer software. Other resources described as singular or integrated can in embodiments be plural or distributed, and resources described as multiple or distributed can in embodiments be combined. The scope of the present teachings is accordingly intended to be limited only by the following claims.

What is claimed is:

1. An apparatus for measuring an input bias current in an operational amplifier, comprising:
   a servo loop;
   a low-leakage amplifier connected to the servo loop;
   a receptacle for the operational amplifier, the receptacle being configured to couple the operational amplifier to the low-leakage amplifier and to the servo loop when the operational amplifier is mounted in the receptacle;
   wherein the servo loop is configured to generate—
      a first leakage current of the low-leakage amplifier without the operational amplifier mounted in the receptacle, and
      a second leakage current of the low-leakage amplifier coupled to the operational amplifier with the operational amplifier mounted in the receptacle, and
   wherein the input bias current of the operational amplifier is generated by subtracting the first leakage current from the second leakage current.

2. The apparatus of claim 1, wherein the low-leakage amplifier comprises an instrumentation amplifier.

3. The apparatus of claim 2, wherein the instrumentation amplifier comprises an instrumentation operational amplifier coupled to a high-impedance input buffer.

4. The apparatus of claim 1, wherein the low-leakage amplifier is connected to a switch to connect the low-leakage amplifier to the servo loop.

5. The apparatus of claim 4, wherein the switch comprises a relay.

6. The apparatus of claim 1, wherein the low-leakage amplifier is connected to at least one switch to connect the low-leakage amplifier to at least one capacitor to integrate a voltage present on at least one input pin of the low-leakage amplifier.

7. The apparatus of claim 6, wherein the at least one switch comprises a relay.

8. The apparatus of claim 1, wherein the operational amplifier is connected to at least one switch to connect the operational amplifier to at least one capacitor to integrate a voltage present on at least one input pin of the operational amplifier.

9. The apparatus of claim 8, wherein the at least one switch comprises a relay.

10. The apparatus of claim 8, further comprising at least one guard circuit configured to shunt a voltage potential between the at least one input pin of the operational amplifier and the at least one guard circuit to ground.

11. The apparatus of claim 1, wherein the receptacle comprises a chip socket.

12. The apparatus of claim 1, wherein the low-leakage amplifier and the operational amplifier are connected in parallel.

13. The apparatus of claim 1, wherein the low-leakage amplifier and the operational amplifier each comprise a non-inverting input pin and an inverting input pin.

14. The apparatus of claim 1, wherein the low-leakage amplifier and the operational amplifier are coupled within a distance of substantially 5 millimeters.

15. A method of measuring an input bias current in an operational amplifier, comprising:
- measuring a first leakage current produced by a low-leakage amplifier connected to a servo loop;
- coupling the low-leakage amplifier to the operational amplifier;
- connecting the coupled low-leakage amplifier and operational amplifier to the servo loop;
- measuring a second leakage current produced by the coupled low-leakage amplifier and operational the low-leakage amplifier via the servo loop; and
- subtracting the first leakage current from the second leakage current to generate the input bias current of the operational amplifier.

16. The method of claim 15, wherein the low-leakage amplifier comprises an instrumentation amplifier.

17. The method of claim 16, wherein the instrumentation amplifier comprises an instrumentation operational amplifier coupled to a high-impedance input buffer.

18. The method of claim 15, wherein the low-leakage amplifier is connected to a switch to connect the low-leakage amplifier to the servo loop.

19. The method of claim 18, wherein the switch comprises a relay.

20. The method of claim 15, wherein the low-leakage amplifier is connected to at least one switch to connect the low-leakage amplifier to at least one capacitor to integrate a voltage present on at least one input pin of the low-leakage amplifier.

21. The method of claim 20, wherein the at least one switch comprises a relay.

22. The method of claim 20, further comprising activating at least one guard circuit configured to shunt a voltage potential between the at least one input pin of the operational amplifier and the at least one guard circuit to ground.

23. The method of claim 15, wherein the operational amplifier is connected to at least one switch to connect the operational amplifier to at least one capacitor to integrate a voltage present on at least one input pin of the operational amplifier.

24. The method of claim 23, wherein the at least one switch comprises a relay.

25. The method of claim 15, wherein the receptacle comprises a chip socket.

26. The method of claim 15, wherein the low-leakage amplifier and the operational amplifier are connected in parallel.

27. The method of claim 15, wherein the low-leakage amplifier and the operational amplifier each comprise a non-inverting input pin and an inverting input pin.

28. The method of claim 15, wherein the low-leakage amplifier and the operational amplifier are coupled within a distance of substantially 5 millimeters.

* * * * *